United States Patent [19]

Sato

[11] Patent Number: 4,653,029
[45] Date of Patent: Mar. 24, 1987

[54] MOS AMPLIFIER AND SEMICONDUCTOR MEMORY USING THE SAME

[75] Inventor: Katsuyuki Sato, Kodaira, Japan
[73] Assignee: Hitachi, Ltd., Tokyo, Japan
[21] Appl. No.: 720,794
[22] Filed: Apr. 8, 1985

[30] Foreign Application Priority Data

Apr. 6, 1984 [JP] Japan .................. 59-67692

[51] Int. Cl.[4] .............................. G11C 7/06
[52] U.S. Cl. .................... 365/205; 365/208; 307/530; 330/257
[58] Field of Search .............. 365/205, 207, 208; 307/530; 330/257, 288

[56] References Cited

U.S. PATENT DOCUMENTS

| 4,136,292 | 1/1979 | Suzuki et al. | 365/208 |
|---|---|---|---|
| 4,247,791 | 1/1981 | Rovell | 365/205 |
| 4,479,202 | 10/1984 | Uchida | 307/530 |
| 4,509,147 | 4/1985 | Tanimura et al. | 365/207 |
| 4,521,704 | 6/1985 | Shinohara et al. | 307/530 |

FOREIGN PATENT DOCUMENTS 0100291  6/1983  Japan .................. 365/205

OTHER PUBLICATIONS

Balasubramanian et al., "Two Device per Bit, Precharged ROS with Differential Sensing", IBM Technical Disclosure Bulletin, vol. 19, No. 1, Jun. 1976, pp. 164-165.

Primary Examiner—James W. Moffitt
Assistant Examiner—Glenn A. Gossage
Attorney, Agent, or Firm—Antonelli, Terry & Wands

[57] ABSTRACT

An amplifier for producing complementary output signals comprises a pair of differential amplification MOSFETs of a first conductivity type receiving a signal to be amplified between the gates thereof, a pair of current mirror circuits consisting of MOSFETs of a second conductivity type and receiving the drain currents of the differential amplification MOSFETs, respectively, and a latch circuit consisting of a pair of MOSFETs of the first conductivity type having the gates and drains thereof cross-connected.

15 Claims, 6 Drawing Figures

MOS AMPLIFIER AND SEMICONDUCTOR MEMORY USING THE SAME

BACKGROUND OF THE INVENTION

This invention relates to an amplifier consisting of MOSFETs (insulated gate field effect transistors) and to a technique which is effective when used, for example, for a main amplifier for amplifying a read-out signal from a memory array in a dynamic type RAM (random access memory).

Figure 1:
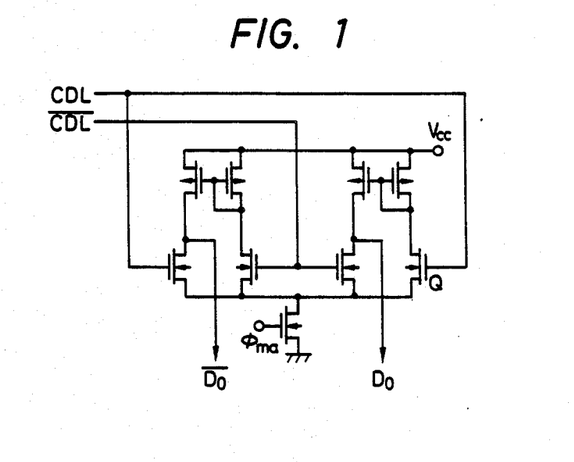
FIG. 1 is a circuit diagram showing an example of the main amplifiers developed previously by the inventor of the present application.

The inventor of the present invention developed previously an MOS amplifier such as shown in FIG. 1 which constitutes a main amplifier in a dynamic type RAM. This MOS amplifier consists of two sets of MOS differential amplifiers, and is arranged to receive complementary input signals in mutually opposite phases and to produce complementary output signals from the respective output terminals. A MOS amplifier similar to the arrangement of FIG. 1 is shown in FIG. 6 of U.S. Pat. No. 4,509,147 issued on Apr. 2, 1985, which patent is hereby incorporated by reference.

Although the circuit of FIG. 1 is useful as a main amplifier, the inventor of the present invention determined that it would be desirable to improve its sensitivity. Regarding the structure of the dynamic type RAMs, it is noted that Japanese Laid-Open No. No. 57-082282 is an example of a prior art reference that describes in detail the dynamic type RAM.

SUMMARY OF THE INVENTION

An object of the present invention is to provide an MOS amplifier which attains improved sensitivity with a simple circuit construction.

The above and other objects and novel features of the present invention will become more apparent from the following description to be taken in conjunction with the accompanying drawings.

Among the inventions disclosed herein, the following will illustrate a typical example.

MOSFETs $Q_2$ and $Q_3$ (see FIG. 2) connected in differential form are prepared for a pair of amplification MOSFETs $Q_1$ and $Q_4$ which receive input signals and which are connected in differential form. The MOSFETs $Q_2$ and $Q_3$ receive at their drains output currents of current mirror circuits which in turn receive the drain currents of the amplification MOSFETs $Q_1$ and $Q_4$ described above. The gates and drains of these MOSFETs $Q_2$ and $Q_3$ are cross-connected, respectively, in order to utilize positive feedback to improve sensitivity.

DESCRIPTION OF THE PREFERRED EMBODIMENTS

Embodiment 1

Figure 2:
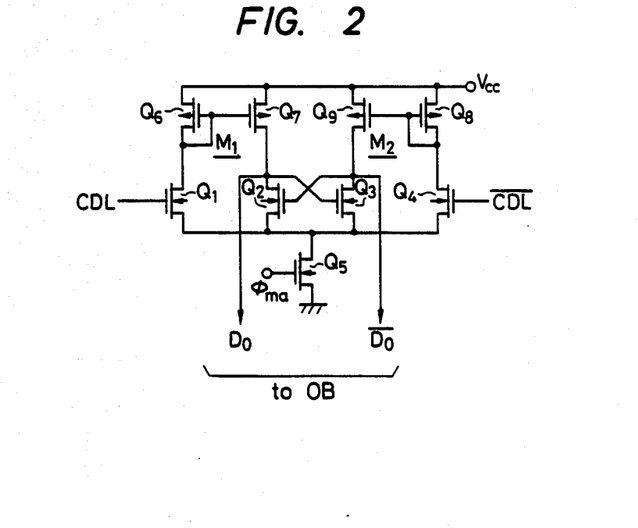
FIG. 2 is a circuit diagram of an MOS amplifier in accordance with one embodiment of the present invention.

FIG. 2 is a circuit diagram of one embodiment of the present invention. Each circuit element in the drawing is formed on a semiconductor substrate such as single crystal silicon, though not particularly limitative, by a known CMOS production technique (complementary MOS).

Though not particularly limitative, the MOS amplifier of this embodiment can be applied to a main amplifier for amplifying read-out signals appearing on common complementary data lines CDL and $\overline{\text{CDL}}$ in the dynamic type RAM which will be discussed later.

N-channel MOSFETs are formed in a semiconductor substrate made of p-type single crystal silicon, for example, and p-channel MOSFETs are formed in an N-type well region formed on the semiconductor substrate The semiconductor substrate constitutes a common substrate gate of the N-channel MOSFETs, while the N-type well region forms the substrate gate of the P-channel MOSFETs. When connected to the output terminals of a backbias voltage generation circuit, for example, the substrate gate of the N-channel MOSFETs is kept at a suitable negative potential. The substrate gate of the P-channel MOSFETs is kept at the potential of a power terminal $V_{cc}$.

The signals of the common complementary data lines CDL and $\overline{\text{CDL}}$ are applied to the gates of amplification MOSFETs $Q_1$ and $Q_4$ that are coupled in differential form. The drains of these amplification MOSFETs $Q_1$ and $Q_4$ are connected to the drains of MOSFETs $Q_6$ and $Q_8$ on the input side of current mirror circuits $M_1$ and $M_2$ that are constituted by P-channel MOSFETs $Q_6$, $Q_7$ and $Q_8$, $Q_9$, respectively. The drains of MOSFETs $Q_7$ and $Q_9$ on the output side of these current mirror circuits $M_1$ and $M_2$ are connected to the drains of N-channel MOSFETs $Q_2$ and $Q_3$, respectively. The sources of these MOSFETs $Q_2$ and $Q_3$ are connected in common to the sources of the amplification MOSFETs $Q_1$ and $Q_4$ in the differential form. To obtain high sensitivity, the gates of MOSFETs $Q_2$ and $Q_3$ are cross-connected to their drains, respectively, thereby forming a positive feedback loop. N-channel MOSFET $Q_5$, its conductance controlled by an operating timing signal $\phi_{ma}$, is interposed between the common source of the amplification MOSFETs $Q_1$ through $Q_4$ and the ground potential point of the circuit. This MOSFET $Q_5$ forms the operating current of the amplification MOSFETs $Q_1$ through $Q_4$.

The circuit of this embodiment operates in the following manner.

When the timing signal $\phi_{ma}$ is at a low level such as about 0 V, MOSFET $Q_5$ is kept off in response thereto, and the amplification circuit is in the inoperative state. In this inoperative state, the outputs $D_o$ and $\overline{D_o}$ are at the high level, that is, at the level of the reset state, and the common source of MOSFETs $Q_1$ through $Q_4$ is at the high level.

When the timing signal $\phi_{ma}$ reaches a high level such as the power source voltage $V_{cc}$, MOSFET $Q_5$ becomes conductive in response thereto, and the amplification circuit starts operating.

When conduction of MOSFET $Q_5$ starts, the potential of the common source of MOSFETs $Q_1$ through $Q_4$ drops. One of the differential operation MOSFETs $Q_1$ and Q4 is rendered strongly conductive in accordance with a read-out level that is given in advance to the common complementary data lines CDL and $\overline{CDL}$. For instance, if the read-out level of one of the common complementary data line CDL is at a higher level than the other $\overline{CDL}$, for example, a greater drain current flows through the amplification MOSFET $Q_1$ than through the amplification MOSFET $Q_4$ when MOSFET $Q_5$ is turned on by the operation timing signal $\phi_{ma}$. The drain currents of these transistors are applied to the drains of the amplification MOSFETs $Q_2$ and $Q_3$ in the latch form through the current mirror circuits $M_1$ and $M_2$, respectively. In this case, the current applied to the drain of the amplification MOSFET $Q_2$ is greater than that applied to the drain of the amplification MOSFET $Q_3$. Therefore, the drain-source potential of MOSFET $Q_2$, that is, the gate-source potential of MOSFET $Q_3$, is rapidly increased. Therefore, the amplification MOSFET $Q_3$ is controlled so as to conduct a greater current. In this case, the current that is supplied from MOSFET $Q_9$ of the current mirror circuit to the drain of MOSFET $Q_3$ is small, and almost all of this current flows through the amplification MOSFET $Q_3$. This MOSFET $Q_3$ absorbs the current supplied to the gate capacitance of the amplification MOSFET $Q_2$ and attempts to turn off the latter. As a result, a positive feedback operation is executed so that almost all the current supplied from MOSFET $Q_7$ of the current mirror circuit $M_1$ flows into the gate capacitance of the amplification MOSFET $Q_3$. Therefore, MOSFET $Q_2$ is abruptly turned off while MOSFET $Q_3$ is turned on, so that the output signal $D_o$ reaches the high level while the output signal $\overline{D_o}$ falls to the low level. These complementary output signals $D_o$ and $\overline{D_o}$ are sent out from the external terminal $D_{out}$ through the output buffer.

When the sources of MOSFETs $Q_2$ and $Q_3$, that are connected in the latch form as shown in FIG. 2, are connected in common to the sources of the differential operation MOSFETs $Q_1$ and $Q_4$, the following desirable circuit operation is executed.

In the transient period of signal amplification, the current mirror circuit $M_1$ produces a current which is proportional to the drain current of MOSFET $Q_1$. Similarly, the current mirror circuit $M_2$ produces a current proportional to the drain current of MOSFET $Q_4$. If MOSFETs $Q_2$ and $Q_3$ connected in the latch form are not yet turned on and off distinctively in the transient period of signal amplification, the output currents of the current mirror circuits $M_1$ and $M_2$ are supplied to the common source of MOSFETs $Q_1$ through $Q_4$ via these MOSFETs $Q_2$ and $Q_3$. These output currents can be regarded as a kind of negative feedback signal.

Here, if the level difference between the common complementary data lines CDL and $\overline{CDL}$ is small, and if the timing signal $\phi_{ma}$ is generated at a timing at which the level difference given to these data lines CDL and $\overline{CDL}$ is not increased sufficiently, the difference of the drain current between MOSFETs $Q_1$ and $Q_4$ is small. The operating speed of MOSFETs $Q_2$ and $Q_3$ connected in the latch form is affected by the difference of the drain current of MOSFETs $Q_1$ and $Q_2$. In accordance with this embodiment, the potential of the common source of MOSFETs $Q_1$ through $Q_4$ is raised by the output currents of the current mirror circuits $M_1$ and $M_2$. As a result, the difference of the drain current of MOSFETs $Q_1$ and $Q_4$ is substantially increased.

The potential rise due to the negative feedback operation of the common source of MOSFETs $Q_1$ through $Q_4$ restricts any erroneous operation of MOSFETs $Q_2$ and $Q_3$ connected in the latch form.

Noise which can be regarded as a common mode noise is often applied to the common complementary data lines CDL and $\overline{CDL}$ through undesirable coupling capacitance such as the gate-source capacitance or gate-drain capacitance of the column switch MOSFETs discussed later.

The negative feedback operation described above reduces the sensitivity of the circuit to the common mode noise without substantially reducing the circuit sensitivity to the signals applied to the data lines CDL and $\overline{CDL}$.

In accordance with this embodiment, the output terminals $\overline{D_o}$ and $D_o$ are automatically reset or brought to the initial level when the timing signal $\phi_{ma}$ is at the low level, that is, when the amplification circuit is in the inoperative state.

In other words, when the timing signal $\phi_{ma}$ is at the low level and hence MOSFET $Q_5$ is turned off, the potential of the common source of MOSFETs $Q_1$ through $Q_4$ is raised by MOSFET of $Q_1$ through $Q_4$ which is rendered conductive. Here, if the common complementary data line CDL is at a higher level than the data line $\overline{CDL}$, the output terminal $D_o$ is at the high level while the output terminal $\overline{D_o}$ is at the low level in response thereto. Correspondingly, MOSFET $Q_2$ is turned off and MOSFET $Q_3$ is turned on. The output terminal $D_o$ is kept at the high level by a floating capacitance (not shown) depending upon the output terminal $D_o$, even though MOSFET $Q_5$ is turned off.

Therefore, when MOSFET $Q_5$ is turned off, the potential applied to the common source is given to the output terminal $\overline{D_o}$ through MOSFET $Q_3$. As a result, the potential of the output terminal $\overline{D_o}$ is raised. If the common complementary data line CDL is at the high level substantially equal to the power source voltage $V_{cc}$, the common source of MOSFETs $Q_1$ through $Q_4$ is raised to about $V_{cc} - V_{th1} - V_{th2}$ (where $V_{th1}$ and $V_{th2}$ are threshold voltages of MSOFETs $Q_6$ and $Q_1$, respectively), and the output terminal $\overline{D_o}$ is likewise raised to about $V_{cc} - V_{th1} - V_{th2}$.

In this manner, the setting time of the output terminals $\overline{D_o}$ and $D_o$ can be made substantially constant when the amplification circuit is brought again into the operative state, as the levels of the output terminals $\overline{D_o}$ and $D_o$ are reset to the initial levels.

In order to bring the initial level of the output terminal $D_o$ better coincidence with that of $D_o$, a resetting MOSFET or an equalizer MOSFET may be disposed between the output terminals $\overline{D_o}$ and $D_o$. Alternatively, resetting MOSFETs may be disposed between the output terminals and the power source terminal $V_{cc}$. In this case, each of the resetting MOSFETs may be small because MOSFET $Q_3$ or $Q_2$ is operated.

When the complementary output signals are generated by one output signal and the output signal of an inverter circuit receiving the former output signal without using the embodiment shown in FIG. 2, one of the complementary output signals is delayed by the inverter circuit.

Figure 3:
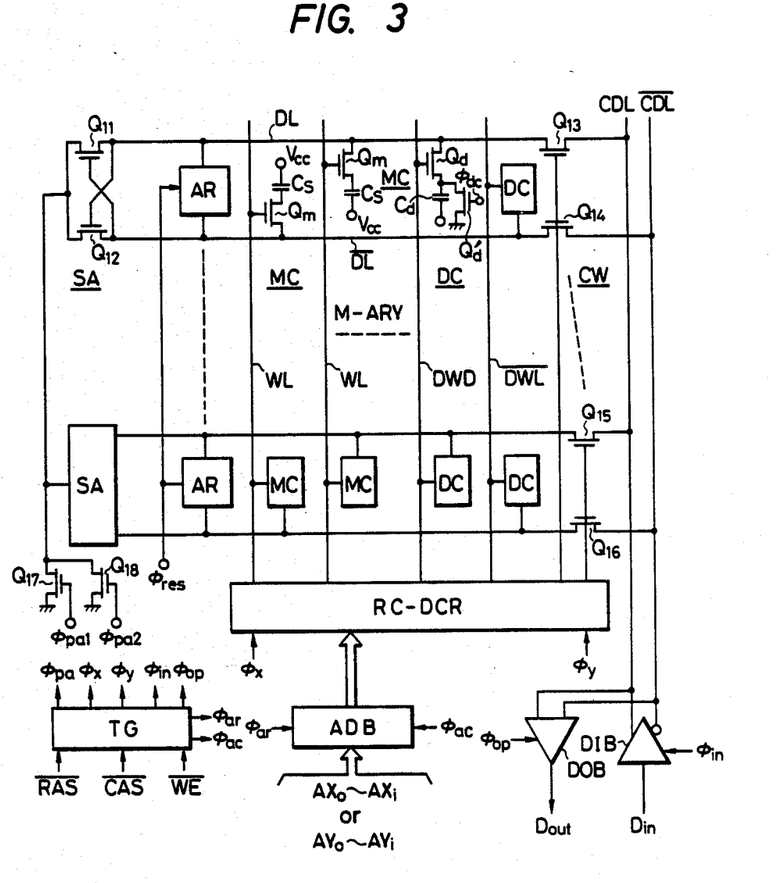
FIG. 3 is a circuit diagram showing an example of dynamic type RAMs using the main amplifier of the present invention.

In contrast, the complementary output signals obtained from the amplification circuit of this invention are not undesirably delayed, but can be regarded as being changed at substantially the same timing. Therefore, a circuit that receives the complementary output signals can be operated at high speed FIG. 3 shows a circuit diagram of one example of a dynamic RAM which uses the MOS amplification circuit of this invention as a main amplifier.

In the circuit of this embodiment shown in the drawing, circuit elements constituting a memory array M-ARY consist of IGFETs (Insulated Gate Field Effect Transistors) typified by N-channel MOSFETs.

Two 1-bit memory cells MCs are shown in the drawing, each consisting of a data storage capacitor Cs and an address selection MOSFET Qm. Data stored in the capacitor Cs is expressed as logic "1" or "0" depending on whether or not an electric charge is present in the capacitor Cs.

Data read-out of any memory cell MC is effected by sensing which change occurs in the potential of the data line DL in accordance with a charge quantity stored in the capacitor Cs when the capacitor Cs is connected to the common data line DL by turning on the address selection MOSFET Qm associated with the capacitor Cs of the memory cell being read.

The memory matrix M-ARY has large scale integration and large memory capacity because each memory cell MC is small and many such memory cells are connected to the common data line DL. Moreover, the ratio of the capacity of capacitor Cs to the floating capacitance Co (not shown) of the common data line DL, that is, Cs/Co, is extremely small. Therefore, the potential change of the data line DL due to the charge quantity stored in the capacitor Cs is an extremely sensitive signal.

A dummy cell DC is disposed as a reference for detecting such a sensitive signal. The dummy cell DC is fabricated in the same production conditions and with the same design constants as the memory cell Mc except that the capacitance of its capacitor Cd is substantially half that of the capacitor Cs of the memory cell MC. The capacitor Cd is charged to the ground potential by MOSFET Qd' before addressing.

Since the capacitance of the capacitor Cd is set to about half of that of the capacitor Cs as described above, it can form a reference voltage which is substantially equal to half of the readout signal from the memory cell MC.

In the drawing, symbol SA represents a sense amplifier which expands the difference of such a potential change caused by addressing described above to a sense period that is determined by timing signals (sense amplifier control signals) $\phi_{pa1}$ and $\phi_{pa2}$. (Its operation will be described elsewhere.) Its input-output nodes are connected to a pair of complementary data lines DL and $\overline{DL}$ that are disposed in parallel with each other. The numbers of memory cells to be connected to the complementary data lines DL and $\overline{DL}$ are equal to each other so as to improve detection accuracy, and one each dummy cell is connected to each of DL and $\overline{DL}$. Each memory cell is folded between one word line WL and one of the pair of the complementary data lines. In the case of a memory matrix of a folded bit line construction, each word line WL crosses both of the data line pairs. Therefore, even when a noise component generated in the word line WL is carried out to the data line due to electrostatic coupling, the noise component appears equally on both of the data line pairs DL and $\overline{DL}$. Such a common mode noise is neglected by the differential type sense amplifier SA.

When the memory cell MC connected to one of the complementary data line pair DL and $\overline{DL}$ is selected in addressing described above, one of the dummy word line pair DWL and $\overline{DWL}$ is always selected so that the dummy cell DC is connected to the other of the data lines.

The sense amplifier SA has a pair of MOSFETs $Q_{11}$ and $Q_{12}$ and that are cross-connected with each other, and the positive feedback operation of these transistors differentially amplifies the delicate signal that appears on the complementary data lines DL and $\overline{DL}$. This positive feedback operation is dividedly carried out in two steps. The positive feedback operation of the first step is started simultaneously with the start of conduction of MOSFET $Q_{17}$ which has relatively small conductance and which is rendered conductive by a relatively rapid timing signal $\phi_{pa1}$. A higher data line potential, which is set on the basis of the potential difference given to the complementary data lines DL and $\overline{DL}$ by addressing, drops at a lower speed while a lower data line potential drops at a higher speed, thereby expanding the potential difference between them.

The circuit operation of the second step is executed at the time at which the potential difference described above becomes great to certain extents. That is, MOSFET $Q_{18}$ which has relatively great conductance is rendered conductive by the timing signal $\phi_{pa2}$, and the lower data line potential described above rapidly drops. Since the operation of the sense amplifier SA is dividedly carried out in two steps in the manner described above, the drop of the higher potential can be prevented. When the lower potential drops below the threshold voltage of the cross-connected MOSFETs, the positive feedback operation is finished, the drop of the higher potential remains at a level lower than the power source voltage $V_{cc}$ but higher than the threshold voltage, and the lower potential finally reaches the ground potential (0 V).

When addressing described above is effected, the stored data that was about to be destroyed is recovered since it receives a high or low level potential such as that which is obtained by the sensing operation. However, if the high level drops by a predetermined level with respect to the power source voltage $V_{cc}$ as described already, the logic is erroneously read as "0" in the course of repetition of read-out and re-writing operations. An active restore circuit AR is disposed in order to prevent this error. This active restore circuit AR does not affect the low level signal at all but selectively boosts only the high level signal to the power source voltage $V_{cc}$.

The data line pair DL and $\overline{DL}$ shown as being representative in the drawing is connected to the common complementary data line pair CDL and $\overline{CDL}$ via MOSFETs $Q_{13}$ and $Q_{14}$ that constitute a column switch CW. The data line pair shown as another representative example are also connected to the complementary data line pair CDL and $\overline{CDL}$ via similar MOSFETs $Q_{15}$ and $Q_{16}$. This common complementary data line pair CDL and $\overline{CDL}$ is connected to the input terminal of a data output buffer DOB including an output amplifier and to the output terminal of a data input buffer DIB. The data output buffer DOB consists of the main amplifier which receives the signals of the common complementary data lines CDL and $\overline{CDL}$ and is shown in FIG. 2, and an output buffer which delivers the signal from the external terminals of the main amplifier.

A row-and-column decoder RC-DCR receives an internal complementary address signal generated by the address buffer ADB, and generates a selection signal for one word line, dummy word line and column switch.

Thus, addressing to the memory cells and dummy cells is effected. In other words, external address signals $AX_o$-$AX_i$ are taken into the address buffer ADB in synchronism with the timing signal $\phi_{ar}$ that is generated by a row address strobe signal $\overline{RAS}$. The internal address signal produced from the address buffer ADB is transmitted to the decoder RC-DCR. Next, the selecting operation of a predetermined word line and dummy word line is effected by a word line selection timing signal $\phi_x$. External address signals $AY_o$-$AY_i$ are taken into the address buffer ADB in synchronism with the timing signal $\phi_{ac}$ generated by the column address strobe signal $\overline{CAS}$, and the internal address signal formed thereby is transmitted to the decoder RC-DCR. When the data line selection timing signal $\phi_y$ is generated, the selection operation of the data lines is effected.

A timing control circuit TG receives the address strobe signals $\overline{RAS}$ and $\overline{CAS}$ supplied from outside and a write enable signal $\overline{WE}$, and generates various timing signals besides the timing signals described above as representative.

Though not particularly limitative, the peripheral circuit of the column selection system in the dynamic type RAM of this embodiment consists of a CMOS static type circuit. This makes it possible to read out a plurality of continuous bits by changing the column address signals under the state in which one word line is selected.

Figure 4:
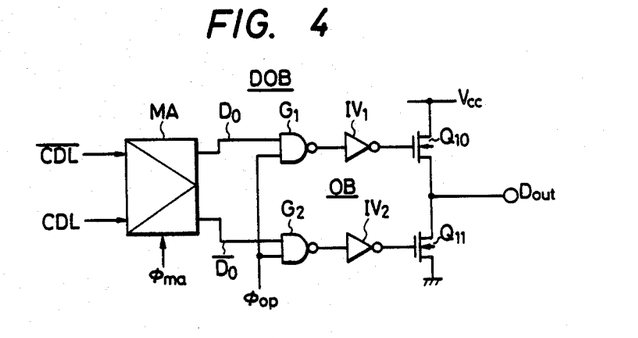
FIG. 4 is a specific circuit diagram of a circuit that can be used as the block DOB in FIG. 3.

FIG. 4 shows a specific circuit diagram of the data output buffer circuit DOB that is shown in FIG. 3. The data output buffer circuit DOB consists of the main amplifier MA having the same construction as the amplifier shown in FIG. 2 and the output buffer OB. The output buffer OB consists of CMOS NAND circuits $G_1$, $G_2$, CMOS inverter circuits $IV_1$, $IV_2$ and N-channel output MOSFETs $Q_{10}$, $Q_{11}$. Thus, the output buffer OB constitutes a tri-state circuit.

When the timing signal $\phi_{op}$ is at the low level, the outputs of the inverter circuits $IV_1$ and $IV_2$ drop to the low level in response thereto, so that the output MOSFETs $Q_{10}$ and $Q_{11}$ are turned off. Therefore, the output of the data output buffer DOB is brought into the high impedance state.

When the timing signal $\phi_{op}$ is at the high level, one of the outputs of the inverter circuits $IV_1$ and $IV_2$ is at the high level with the other being at the low level in accordance with the complementary output signals supplied from the main amplifier. In consequence, the output MOSFETs $Q_{10}$ and $Q_{11}$ are turned on complementarily, and the external terminal $D_{out}$ is brought to the high or low level.

In accordance with this embodiment, the output MOSFETs $Q_{10}$ and $Q_{11}$ can be made of the single channel type, that is, of the N-channel type, although the dynamic RAM is fabricated as a whole by CMOS integration circuit technique. This construction provides the following advantages.

The output MOSFETs $Q_{10}$ and $Q_{11}$ must have sufficiently low ON resistance in order to sufficiently drive a relatively heavy capacitance load that is connected to the external terminal but is not shown in the drawing. Therefore, these transistors are large. If MOSFET $Q_{10}$ consists of a P-channel MOSFET, it must be two or three times as large as an N-channel MOSFET $Q_{11}$. As a result, the area occupied by MOSFETs $Q_{10}$ and $Q_{11}$ is large. If MOSFET $Q_{10}$ consists of an N-channel transistor in the same way as MOSFET $Q_{11}$, however, the area they occupy can be reduced.

If an abnormal voltage of an undesirable level is applied to the external terminal in the CMOS structure, a parasitic thyristor operation will occur, and the power source wiring layer on the semiconductor substrate will be damaged by abnormal power source current due to the parasitic thyristor operation.

If both MOSFETs $Q_{10}$ and $Q_{11}$ are of the single channel type MOSFETs, however, parasitic thyristor operation does not substantially occur even if an abnormal voltage is applied to the external terminal $D_{out}$.

Embodiment 2

Figure 5:
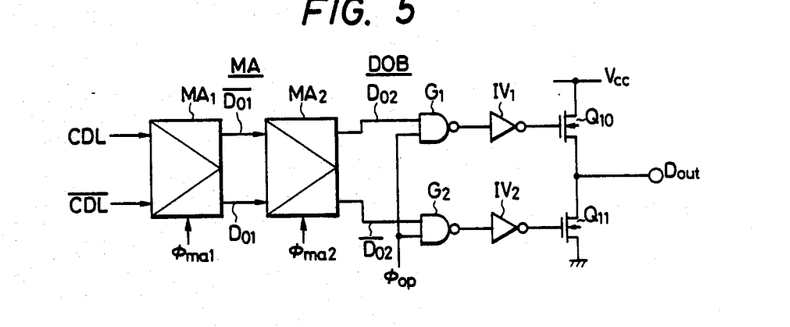
FIGS. 5 and 6 are circuit diagrams of the other embodiments of the present invention.

FIG. 5 shows a circuit diagram of a data output buffer DOB in accordance with another embodiment of the invention. In this embodiment, the main amplifier MA consists of cascaded amplifiers MA1 and MA2 in order to obtain higher sensitivity. Each of the amplifiers MA1 and MA2 is the same as the amplifier shown in FIG. 2.

Though not particularly limitative, the amplifier MA1 is actuated by the timing signal $\phi_{ma1}$, while the amplifier MA2 is actuated by the timing signal $\phi_{ma2}$ which is somewhat delayed from the timing signal $\phi_{ma1}$.

Since each of the amplifiers MA1 and MA2 has the complementary input terminal and the complementary output terminal, or since each amplifier MA1, MA2 consists of a full differential amplifier, the main amplifier MA can be made to be responsive to the input signals without being made to be responsive substantially to the noise that is unavoidably applied to the common complementary data lines CDL and $\overline{CDL}$ and to the output terminals $\overline{D_{ol}}$ and $D_{ol}$ via an undesirable coupling capacitance.

Embodiment 3

Figure 6:
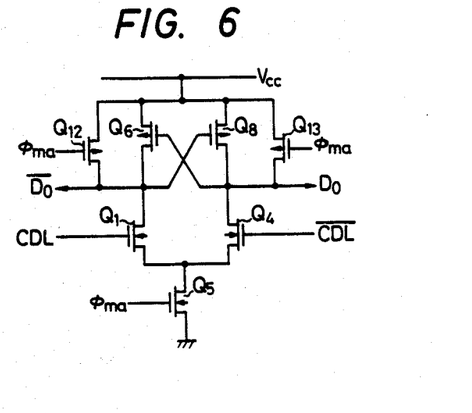

FIG. 6 is a circuit diagram of the amplifier in accordance with still another embodiment of the present invention. In the amplifier of this embodiment, P-channel MOSFETs $Q_6$ and $Q_8$ as the load to the differential N-channel MOSFETs $Q_1$ and $Q_4$ are connected in the latch form. P-channel MOSFETs $Q_{12}$ and $Q_{13}$ for resetting are connected in parallel with MOSFETs $Q_6$ and $Q_8$, respectively.

When the timing signal $\phi_{ma}$ is at the low level, the amplifier is inoperative. In this case, resetting MOSFETs $Q_{12}$ and $Q_{13}$ are turned on, and the output terminals $\overline{D_o}$ and $D_o$ are reset almost to the level of the power source voltage $V_{cc}$.

When the timing signal $\phi_{ma}$ is at the high level, MOSFET $Q_5$ is turned on while MOSFETs $Q_{12}$ and $Q_{13}$ are turned off. As a result, the amplifier becomes operative.

The amplifier of this embodiment has a reduced number of circuit elements.

The present invention described with regard to the various embodiments above has the following effects and advantages.

(1) The amplifier can obtain a high gain by means of the active load circuit consisting of the current mirror circuits. In the two MOS differential amplification circuits, MOSFETs that receive the differential currents are connected in the latch form. Therefore, the high gain described above and the positive feedback operation operate synergistically, and a high sensitivity MOS amplifier can be obtained.

(2) Since only a part of the wiring of a differential amplifier having two active load circuits is changed relative to the circuit of FIG. 1, a high sensitivity MOS amplifier can be constituted without increasing the number of circuits elements.

(3) Since the amplifier has high sensitivity, the common complementary data lines can be responsive even to a delicate signal when the amplifier is utilized as the main amplifier in a dynamic RAM. Therefore, the operation timing of the main amplifier can be sped up, and read-out at a higher speed can be accomplished.

(4) Due to the effect (3) described above, the operation margin of the main amplifier can be expanded by its high sensitivity.

(5) When the amplifier of the invention is applied to the main amplifier of a dynamic RAM having the function of continuously reading out data of a plurality of bits by means of the column change-over by fabricating the column system selection circuit in the form of a static type circuit, continuous read-out of the data of a plurality of bits can be made at a high speed because of the effect (3) described above.

Although the invention has thus been described with reference to some preferred forms thereof, the invention is not particularly limited thereto, but can, of course, be modified in various ways without departing from the scope and spirit thereof. For example, N-channel MOSFETs and P-channel MOSFETs may be replaced by one another, respectively. In the amplification MOSFETs $Q_1$ and $Q_4$, the signal to be amplified may be applied to the gate of one of these transistors with a reference voltage being applied to the gate of the other.

Although the description given above deals with the case where the amplifier of the invention is applied to the main amplifier of the dynamic RAM which is the background and technical field of the invention, it is not particularly limited thereto, but can be widely utilized as an MOS amplifier.

It is to be understood that the above-described arrangements are simply illustrative of the application of the principles of this invention. Numerous other arrangements may be readily devised by those skilled in the art which embody the principles of the invention and fall within its spirit and scope.

What is claimed is:

1. An MOS amplifier comprising:
    first and second insulated gate field effect transistors respectively coupled to one another for differentially amplifying input signals applied to the gates of said first and second insulated gate field effect transistors;
    a third insulated gate field effect transistor receiving at the drain thereof a current corresponding to the drain current of said first insulated gate field effect transistor;
    a fourth insulated gate field effect transistor receiving at the drain thereof a current corresponding to the drain current of said second insulated gate field effect transistor;
    a positive feedback circuit applying the drain potential of said third insulated gate field effect transistor to the gate of said fourth insulated gate field effect transistor, and the drain potential of said fourth insulated gate field effect transistor to the gate of said third insulated gate field effect transistor;
    a first output node whose level is determined by the drain potential of said third insulated gate field effect transistor;
    a second output node whose level is determined by the drain potential of said fourth insulated gate field effect transistor;
    a first current mirror circuit receiving the drain current of said first insulated gate field effect transistor, and producing a current to be supplied to the drain of said third insulated gate field effect transistor; and
    a second current mirror circuit receiving the drain current of said second insulated gate field effect transistor and producing a current to be supplied to the drain of said fourth insulated gate field effect transistor.

2. An MOS amplifier according to claim 1, wherein the gate of said first insulated gate field effect transistor is coupled to receive an input signal which is complementary to an input signal applied to the gate of said second insulated gate field effect transistor.

3. An MOS amplifier according to claim 1, wherein a signal to be amplified is applied to the gate of said first insulated gate field effect transistor and a reference signal having a predetermined reference level is applied to the gate of said second insulated gate field effect transistor.

4. An MOS amplifier according to claim 1, wherein each of said first and second current mirror circuits are comprised of insulated gate field effect transistors of a first channel conductivity type, and each of said first through fourth insulated gate field effect transistors are comprised of an insulated gate field effect transistor of a second channel conductivity type opposite to said first channel conductivity type.

5. An MOS amplifier according to claim 4, which further includes a fifth insulated gate field effect transistor of said second channel conductivity type, and in which the sources of said first through fourth insulated gate field effect transistors are connected in common, and said fifth insulated gate field effect transistor is disposed between the sources thus connected in common and a reference potential point of the circuit.

6. An MOS amplifier according to claim 5, wherein a gate of said fifth insulated gate field effect transistor is coupled to receive a timing signal which controls the conduction of said fifth insulated gate field effect transistor to render the amplifier operative when said timing signal has a first level of voltage and inoperative when said timing signal has a second level of voltage.

7. An MOS amplifier according to claim 6, wherein the gate of said first insulated gate field effect transistor is coupled to receive an input signal which is complementary to an input signal applied to the gate of said second insulated gate field effect transistor.

8. A semiconductor memory comprising:
    a memory matrix comprised of a plurality of data lines, a plurality of word lines, and a plurality of memory cells having data input-output terminals connected to corresponding data lines, and selection terminals connected to corresponding word lines, respectively;
    a pair of common data lines;
    a column switch circuit receiving a selection signal and including means for connecting a pair of data lines designated by the selection signal from a plurality of said data lines to the pair of common data lines; and
    an amplifier having a pair of input terminals connected to the pair of said common data lines;
    said amplifier comprising:

a pair of first and second insulated gate field effect transistors receiving at the gates thereof a potential difference between said common data lines;

a third insulated gate field effect transistor receiving at the drain thereof a current corresponding to the drain current of said first insulated gate field effect transistor;

a fourth insulated gate field effect transistor receiving at the drain thereof a current corresponding to the drain current of said second insulated gate field effect transistor;

a feedback circuit applying the drain potential of said third insulated gate field effect transistor to the gate of said fourth insulated gate field effect transistor, and applying the drain potential of said fourth insulated gate field effect transistor to the gate of said third insulated gate field effect transistor;

a first output node whose level is determined by the drain potential of said third insulated gate field effect transistor; and a second output node whose level is determined by the drain potential of said fourth insulated gate field effect transistor.

9. A semiconductor memory according to claim 8, wherein said amplifier further includes a fifth insulated gate field effect transistor and which the sources of said first through fourth insulated gate field effect transistors are connected in common, and said fifth insulated gate field effect transistor is disposed between the sources thus connected in common and a reference potential point of the circuit.

10. A semiconductor memory according to claim 8, wherein said pair of common data lines provide data signals that are complementary to one another, respectively, and wherein said first insulated gate field effect transistor has its gate coupled to one of said pair of common data lines and the second insulated gate field effect has its gate coupled to the other of said pair of common data lines so that said first and second insulated gate field effect transistors receive complementary data signals.

11. A semiconductor memory according to claim 10, which further includes:

a first current mirror circuit receiving the drain current of said first insulated gate field effect transistor, and producing a current to be supplied to the drain of said third insulated gate field effect transistor; and a second current mirror cirucit receiving the drain current of said second insulated gate field effect transistor and producing a current to be supplied to the drain of said fourth insulated gate field effect transistor.

12. A semiconductor memory according to claim 11, wherein each of said first and second current mirror circuits are comprised of insulated gate field effect transistors of a first channel conductivity type, and each of said first through fourth insulated gate field effect transistors are comprised of an insulated gate field effect transistor of a second channel conductivity type opposite to said first channel conductivity type.

13. A semiconductor memory according to claim 12, which further includes a fifth insulated gate field effect transistor of said second channel conductivity type, and in which the sources of said first through fourth insulated gate field effect transistors are connected in common, and said fifth insulated gate field effect transistor is disposed between the sources thus connected in common and a reference potential point of the circuit.

14. A semiconductor memory according to claim 13, wherein a gate of said fifth insulated gate field effect transistor is coupled to receive a timing signal which controls the conduction of said fifth insulated gate field effect transistor to render the amplifier operative when said timing signal has a first level of voltage and inoperative when said timing signal has a second level of voltage.

15. An MOS amplifier comprising:

first and second insulated gate field effect transistors respectively coupled to one another for differentially amplifying input signals applied to the gates of said first and second insulated gate field effect transistors, wherein the source of said first and second insulated gate field effect transistors are coupled in common to one another;

a third insulated gate field effect transistor having its source-drain path coupled in series with the source-drain path of said first insulated gate field effect transistor, said third insulated gate field effect transistor being located between a first reference voltage source and said first insulated gate field effect transistor so that the drain of said third insulated gate field effect transistor is coupled to the drain of said first insulated gate field effect transistor;

a fourth insulated gate field effect transistor having its source-drain path coupled in series with the source-drain path of said second insulated gate field effect transistor, said fourth insulated gate field effect transistor being located between the first reference voltage source and said second insulated gate field effect transistor so that the drain of said fourth insulated gate field effect transistor is coupled to the drain of said second insulated gate field effect transistor;

a positive feedback circuit applying the drain potential of said third insulated gate field effect transistor to the gate of said fourth insulated gate field effect transistor, and the drain potential of the fourth insulated gate field effect transistor to the gate of said third insulated gate field effect transistor;

a first output node coupled between the drains of said first and third insulated gate field effect transistors;

a second output node coupled between the drains of said second and fourth insulated gate field effect transistor;

a fifth insulated gate field effect transistor coupled between the common sources of said first and second insulated gate field effect transistors and a second reference potential, wherein a gate of said fifth insulated gate field effect transistor is coupled to receive a timing signal which controls the conduction of said fifth insulated gate field effect transistor to render the amplifier operative when said timing signal has a first level of voltage and inoperative when said timing signal has a second level of voltage; and a sixth insulated gate field effect transistor coupled in parallel with said third insulated gate field effect transistor between said first reference potential and said first output node and a seventh insulated gate field effect transistor coupled in parallel with said fourth insulated gate field effect transistor between said first reference potential and said second output node, wherein gates of said sixth and seventh insulated gate field effect transistors are coupled to receive the same timing signal which is applied to the gate of said fifth insulated gate field effect transistor, and wherein said sixth and seventh insulated gate field effect transistors have a conductivity type opposite to that of said fifth insulated gate field effect transistor so that when said timing signal has said second voltage level rendering said amplifier inoperative, said sixth and seventh insulated gate field effect transistors will be turned on to reset said first and second output nodes to a level substantially corresponding to that of said first reference voltage source.

* * * * *